United States Patent
Chiba et al.

[11] Patent Number: 6,123,401
[45] Date of Patent: Sep. 26, 2000

[54] HOUSING DEVICE WITH COVER

[75] Inventors: Kazuya Chiba, Ibaraki; Kaoru Shimizu, Osaka, both of Japan

[73] Assignee: Matsushita Electric Industrial Co., Ltd., Osaka, Japan

[21] Appl. No.: 09/331,412
[22] PCT Filed: Mar. 24, 1998
[86] PCT No.: PCT/JP98/01293
 § 371 Date: Jun. 21, 1999
 § 102(e) Date: Jun. 21, 1999
[87] PCT Pub. No.: WO99/21342
 PCT Pub. Date: Apr. 29, 1999

[30] Foreign Application Priority Data

Oct. 22, 1997 [JP] Japan ................... 9-289395

[51] Int. Cl.⁷ .................................................. E05D 11/10
[52] U.S. Cl. ............................................. 312/328; 16/332
[58] Field of Search .......................... 16/331, 332, 303, 16/334, 325; 312/326, 327, 328, 329, 223.1, 223.2; 379/433, 434, 428; 220/836, 840, 842, 844, 848; 455/90, 128, 351, 575; 348/734

[56] References Cited

U.S. PATENT DOCUMENTS

| | | | |
|---|---|---|---|
| 3,333,726 | 8/1967 | Belanger | 220/836 |
| 4,745,397 | 5/1988 | Lagerbauer et al. | 348/734 |
| 4,791,244 | 12/1988 | Taybl | 312/328 X |
| 5,259,019 | 11/1993 | Stilley | 379/428 X |
| 5,507,013 | 4/1996 | Weadon et al. | |
| 5,678,206 | 10/1997 | Ishii | 455/90 |
| 5,813,093 | 9/1998 | Giordano, Jr. et al. | 16/331 X |
| 5,905,796 | 5/1999 | Jung | 16/331 X |

FOREIGN PATENT DOCUMENTS

| | | |
|---|---|---|
| 0272042 | 6/1988 | European Pat. Off. . |
| 0765063 | 3/1997 | European Pat. Off. . |
| 19608473 | 9/1997 | Germany . |
| S58-180187 | 12/1983 | Japan . |
| S62-41435 | 10/1987 | Japan . |
| 1-315195 | 12/1989 | Japan . |
| 09246744 | 1/1998 | Japan . |
| 2256424 | 12/1992 | United Kingdom . |

OTHER PUBLICATIONS

WIPO Publication WO 9621988 dated Jul. 18, 1996.

Primary Examiner—Janet M. Wilkens
Attorney, Agent, or Firm—McDermott, Will & Emery

[57] ABSTRACT

A pair of spindles 2 are formed on both sides of an end of a housing body 1, and a pair of extended parts 5 facing each other, are formed on an end of a cover 4. On each opposite face of the extended parts 5, a hole 6 rotatively engaging with the spindle 2, a slope 7 guiding the spindle 2 to the hole 6 in mounting the cover to the housing body 1, and another slope 8 guiding the spindle 2 out from the extended part 5 in detaching the cover 4 from the housing body 1, are formed. Those elements enable the cover 4 to be mounted/detached to/from the housing body 1 with ease as well as free from damage.

13 Claims, 6 Drawing Sheets

HOUSING DEVICE WITH COVER

TECHNICAL FIELD

The present invention relates to a housing device with a cover, i.e. a lid, or a door which covers an opening of a case, a cabinet, or a control panel of an electric apparatus, and a housing including the case or the cabinet, to which the lid or the door is mounted or detached with ease.

BACKGROUND ART

An electric apparatus, e.g. a television receiver has a control panel on its front side having a cover mounted thereto with a hinge. A lid of a remote control is also hinged to the remote control, a door of a cabinet which houses an electric apparatus is also hinged to the cabinet, and double doors of a box on which an electric apparatus is placed are also hinged to the box. Those are the conventional structure of a housing device having a cover, therefore, in general, it is not easy to mount/detach the lid, door, or double doors to/from the case, or box.

On the other hand, a mounting method of a cover to a remote control as shown in FIGS. 5 and 6 is also available. FIG. 5 is a perspective view of the remote control when its cover is opened, and FIG. 6 is a perspective view of an essential part of the remote control and its cover before the cover is mounted to the body.

In FIG. 6, the body 21 of the remote control has a pair of spindles 22 on both sides on its first end. (One spindle 22 is shown, but another spindle 22 is not shown.) The cover 23 has a pair of elastic extended parts 24 shaped in a cantilever on both sides of its first end, and the pair of elastic extended parts 24 face each other.

On a facing side of the pair of the elastic extended parts 24, a hole 25 to be rotatively engaged with the spindle 22 is disposed. (A hole 25 on one side is shown, and the counterpart hole 25 is not shown.) When the cover 23 is mounted to the body 21, the elastic extended parts 24 are opened outside using the elasticity, and the spindles 22 of the body 21 are fit into the holes 25. Therefore, when the cover 23 is detached from the body 21, the elastic extended parts 24 are opened outside forcibly. This structure always accompanies a cumbersome work for mounting/detaching the cover 23 to/from the body 21 such as opening the extended parts 24 outside forcibly. In this cumbersome work, if an extra force is applied to the extended parts 24, bending stress is applied to a base of the extended part 24, which is sometimes permanently deformed, or cracked. The cover 23 cracked or having a permanent set cannot be reused. This mounting/detaching work is done by manual and difficult done by machines. In FIG. 5, a denote 26 represents a bottom disposed on the remote control, and 27 represents a hole punched on the cover 23 corresponding to the bottom 26. Through the hole 27, the bottom 26 is protruded.

The present invention addresses the above problems, and aims to provide a housing device having a cover, with which a mounting/detaching of the cover to/from the housing body can be done with ease, while no crack and no permanent set occur on the cover, further, a rate of reuse or recycle of the housing device having the cover increases.

DISCLOSURE OF THE INVENTION

The present invention relates particularly to a housing device with a cover, comprising a housing body and a cover for covering switches of the remote control. A structure of the housing device with a cover is outlined as follows:

The housing body has a pair of spindles on both sides of its first end. The cover has a pair of extended parts on both sides of its first end, and the pair of extended parts face each other. On a facing side of the pair of the extended parts, the following three elements are formed, i.e. (1) a pair of holes to be rotatively engaged with the pair of spindles, (2) a pair of fist slopes guiding the pair of spindles to the pair of holes when the cover is mounted to the housing body, and (3) a pair of second slopes guiding the pair of the spindles outside the pair of holes are formed. Thanks to these three elements, the cover can be easily mounted/detached to/from the housing body without damaging the cover per se.

The above structure is more specifically detailed as follows:

(1) The housing device with a cover according to the present invention comprises the following elements;
  (a) a housing body having a spindle on both sides thereof,
  (b) a cover having a hole rotatively engaging with the spindle, and a slope guiding the spindle to the hole so that the spindle engages with the hole when the cover is mounted to the housing body, where a height of the slope increases gradually from an edge of the cover to the hole.

(2) The housing device with a cover according to the present invention comprises the following elements:
  (a) a housing body having a spindle on both sides thereof,
  (b) a cover having a hole rotatively engaging with the spindle, and a slope guiding the spindle outside the hole so that the spindle detaches from the hole when the cover is detached from the housing body, where a height of the slope increases gradually from the hole to an edge of the cover.

(3) The housing device with a cover according to the present invention comprises the following elements:
  (a) a housing body having a spindle on both sides thereof,
  (b) a cover having the following three elements: (b-1) a hole rotatively engaging with the spindle, (b-2) a first slope guiding the spindle to the hole so that the spindle engages with the hole when the cover is mounted to the housing body, where a height of the first slope increases gradually from an edge of the cover to the hole, and (b-3) a second slope guiding the spindle outside the hole so that the spindle detaches from the hole when the cover is detached from the housing body, where a height of the second slope increases gradually from the hole to an edge of the cover.

Any one of the above structure (1), (2) and (3) can realize an easy mounting/detaching of the cover to/from the housing body, and thus the work efficiency is increased. A rate of reuse or recycle of the cover also increases, thereby contributing to environmental protection as well as saving resources.

BRIEF DESCRIPTION OF THE DRAWINGS

FIG. 2b is a cross section taken on line Y—Y of FIG. 2a.

FIG. 2c is a cross section taken on line X—X of FIG. 2a.

DETAILED DESCRIPTION OF THE PREFERRED EMBODIMENTS OF THE INVENTION

Preferred embodiments according to the present invention are described hereinafter by referring to FIG. 1 through FIG. 4d.

Embodiment 1

Figure 1:
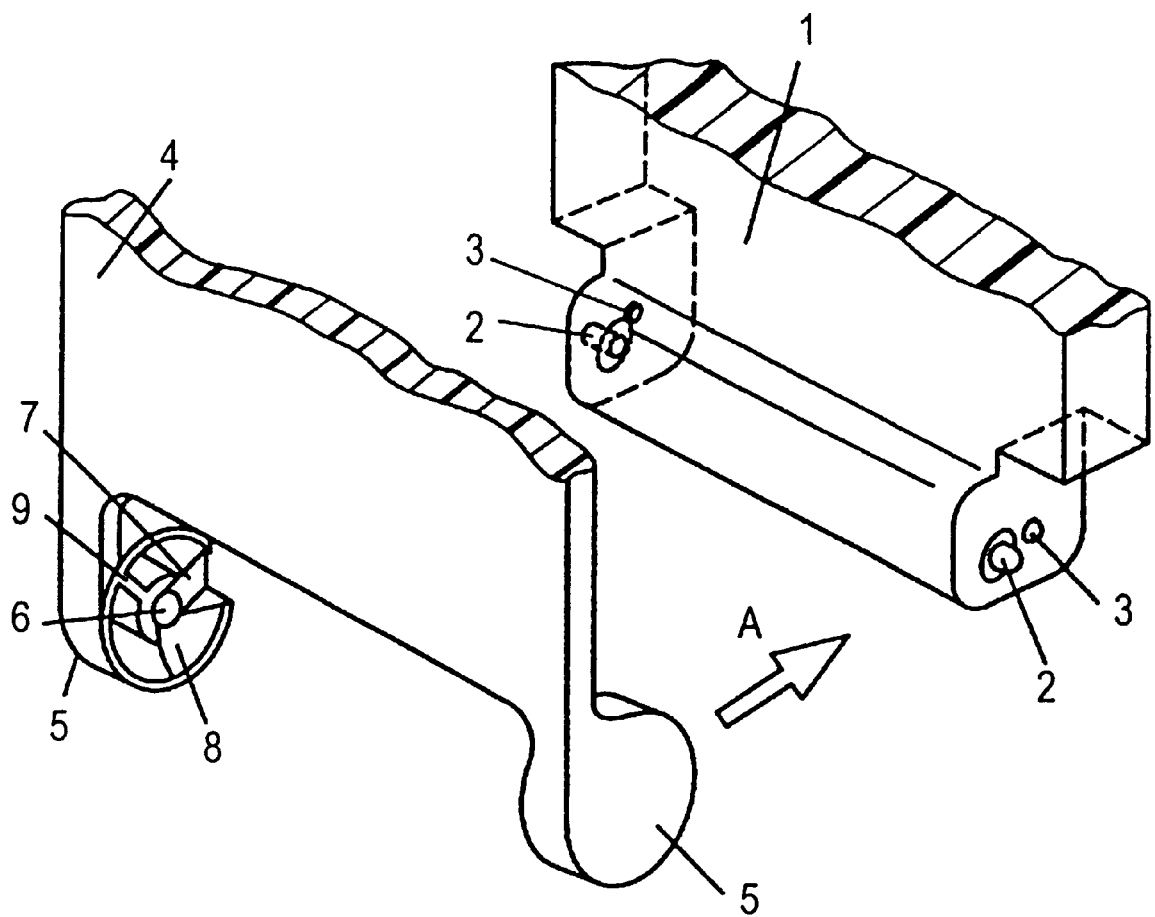
FIG. 1 is a perspective view of an essential part of a housing device according to the present invention before the device is assembled.
Figure 2A:
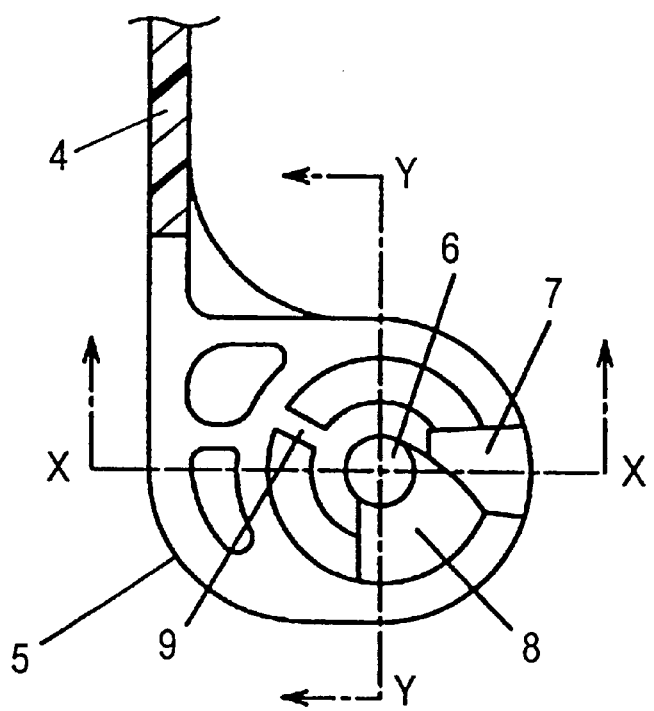
FIG. 2a is a front view of an extended part viewed inside, of the cover of the housing device according to the present invention.
Figure 2B:
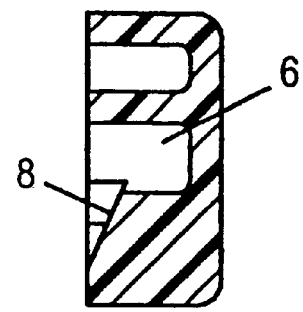
Figure 2C:
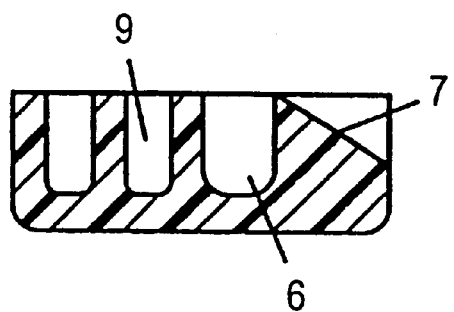

In FIG. 1 through FIG. 2c, a housing device with a cover comprises the following elements:

(a) a housing body 1 comprises the following sub-elements;
  (a-1) a pair of spindles 2 disposed at both sides on a first end of the housing body 1,
  (a-2) a pair of protrusions 3 having a spherically shaped head disposed at both sides on a first end of the housing body 1, where the protrusions 3 are located at a predetermined distance from the spindles 2, (b) a cover 4 comprises the a pair of elastic and extended parts 5 facing each other, being shaped in a cantilever, and disposed at both sides on a first end of the cover 4, and the extended parts 5 comprise the following sub-elements;
  (b-1) a pair of holes 6 having bottoms disposed on the facing sides of the extended parts 5, i.e. on the inside faces thereof, so that the spindles 2 are engaged with the holes (one hole 6 is shown in the Figs., however; another hole 6 is not shown.)
  (b-2) a pair of mounting guide faces 7 (the first slope) utilized for guiding the spindles 2 to be engaged with the holes 6, when the cover 4 is mounted to the housing body 1 (one guide face 7 is shown in the Figs., but the other guide face 7 is not shown.)
  (b-3) a pair of detaching guide faces 8 (the second slope) utilized for guiding the spindles 2 to be detached from the holes 2, when the cover 4 is detached from the housing body 1 (one guide face 8 is shown in the Figs., but the other guide face 8 is not shown.)
  (b-4) a pair of ribs 9 disposed near the holes 6, and utilized as a bar against a rotation of the extended parts 5 through being hit by the protrusions 3 disposed on the housing body 1 (one rib 9 is shown in the Figs., but the other rib 9 is not shown.)

The height of the mounting guide face 7 increases gradually from an outer edge of the cover 4 (actually, the outer edge of the extended part 5) to the hole 6, and the height of the detaching guide face 8 increases gradually from the hole 6 to the outer edge of the cover 4 (actually, the outer edge of the extended part 5.)

Now, how to mount the cover 4 to the housing body 1 is described by referring to FIG. 1.

(1) Place the cover 4 upon the housing body 1 along the arrow mark A so that the mounting guide face 7 substantially meets the spindle 2.

(2) Press the pair of the extended part 5 toward the housing body 1 along the arrow mark A, then the spindle 2 touches the mounting guide face 7 and the pair of extended parts 5 start opening outside (in the case of the housing body of a remote control, the extended parts open along its width direction.)

(3) Further press and push the extended parts 5 by touching the mounting guide face 7 to the spindle 2 until those two elements are engaged with each other, which produces a click sound.

The mounting guide face 7, as described above, helps identifying the mounting point between the housing body 1 and the cover 4, and avoids slippage of the cover 4 when the spindle 2 is engaged with the hole 6.

Further, the mounting guide face 7 regulates elastic deformation of the extended part 5 to a minimum quantity, and also prevents the root of the extended part 5 from being cracked.

Next, how to detach the cover 4 from the housing body 1 is described by referring to FIG. 4a–FIG. 4d and FIG. 3.

Figure 3:
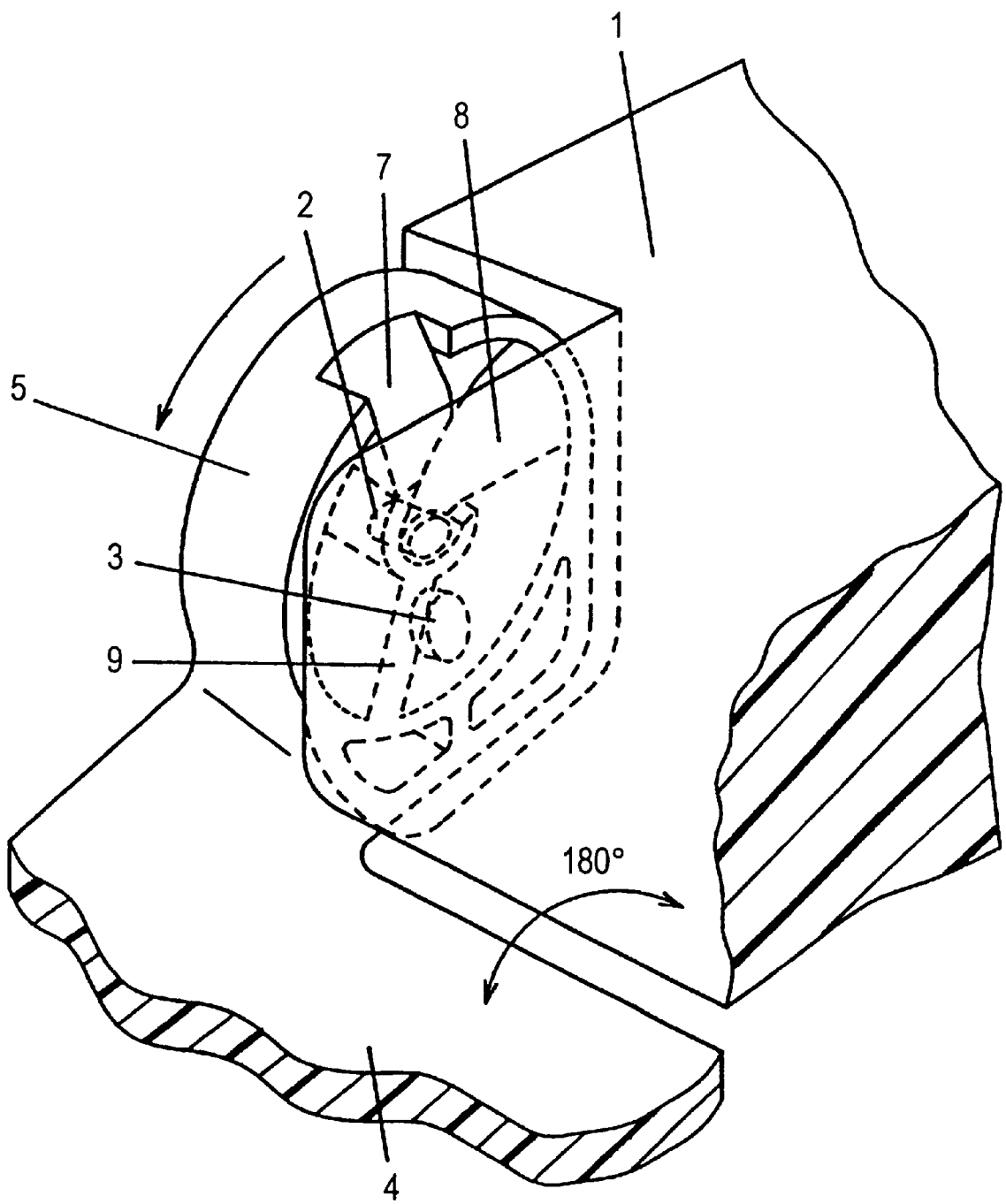
FIG. 3 is a perspective view of an essential part of the housing device with the cover when the cover is opened by 180°.
Figure 4A:
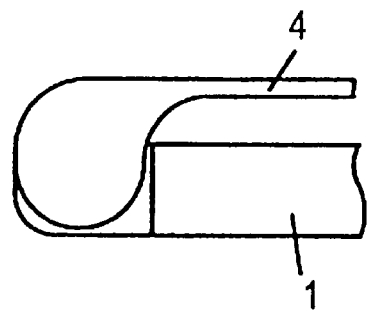
FIG. 4a through FIG. 4d depicts steps how to detach the cover from the housing body.
Figure 4B:
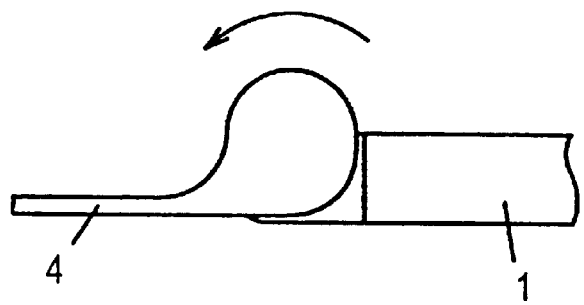

(1) Rotate the cover 4 by 180° to open the housing device as shown in FIG. 4a and FIG. 4b FIG. 3 shows an essential part of the cover 4 being opened. When the cover 4 is opened by 180°, the rib 9 hits the protrusion 3, and the cover 4 stops being opened.

(2) Push down the cover 4 further, then the rib 9 leans on the spherical head of the protrusion 3, and the extended part 5 start opening due to elastic deformation along a direction of detaching from the spindle 2.

Figure 4C:
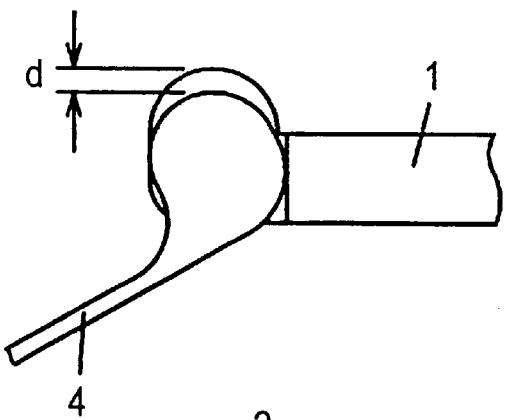

(3) Further push down the cover 4, then the rib 9 arrives at the top of spherical head of the protrusion 3, and then the hole 6 detaches and slips off from the spindle 2 by a predetermined distance, whereby the spindle 2 relatively is moved to a dint (staring point of the slope) of the detaching guide face 8. FIG. 4c shows this status, where "d" represents slippage quantity.

Figure 4D:
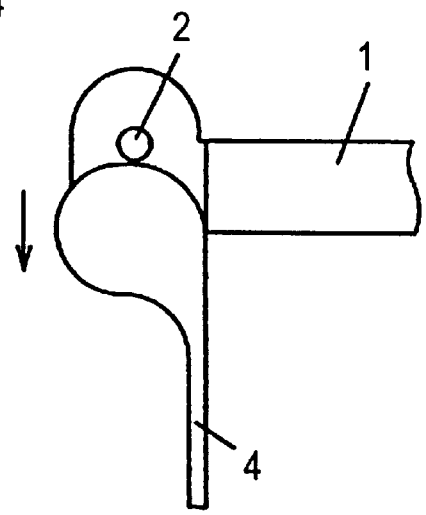
Figure 5:
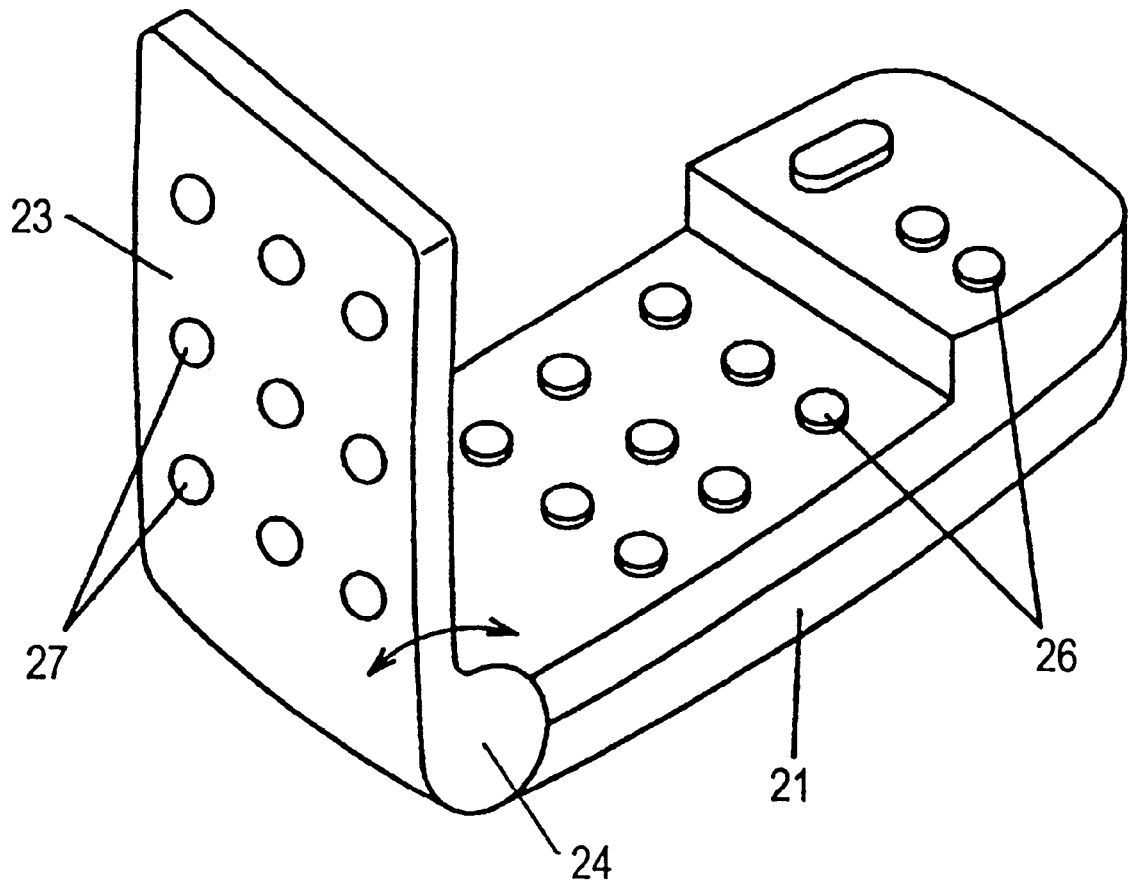
FIG. 5 is a perspective view of a remote control as a conventional housing device with a cover.
Figure 6:
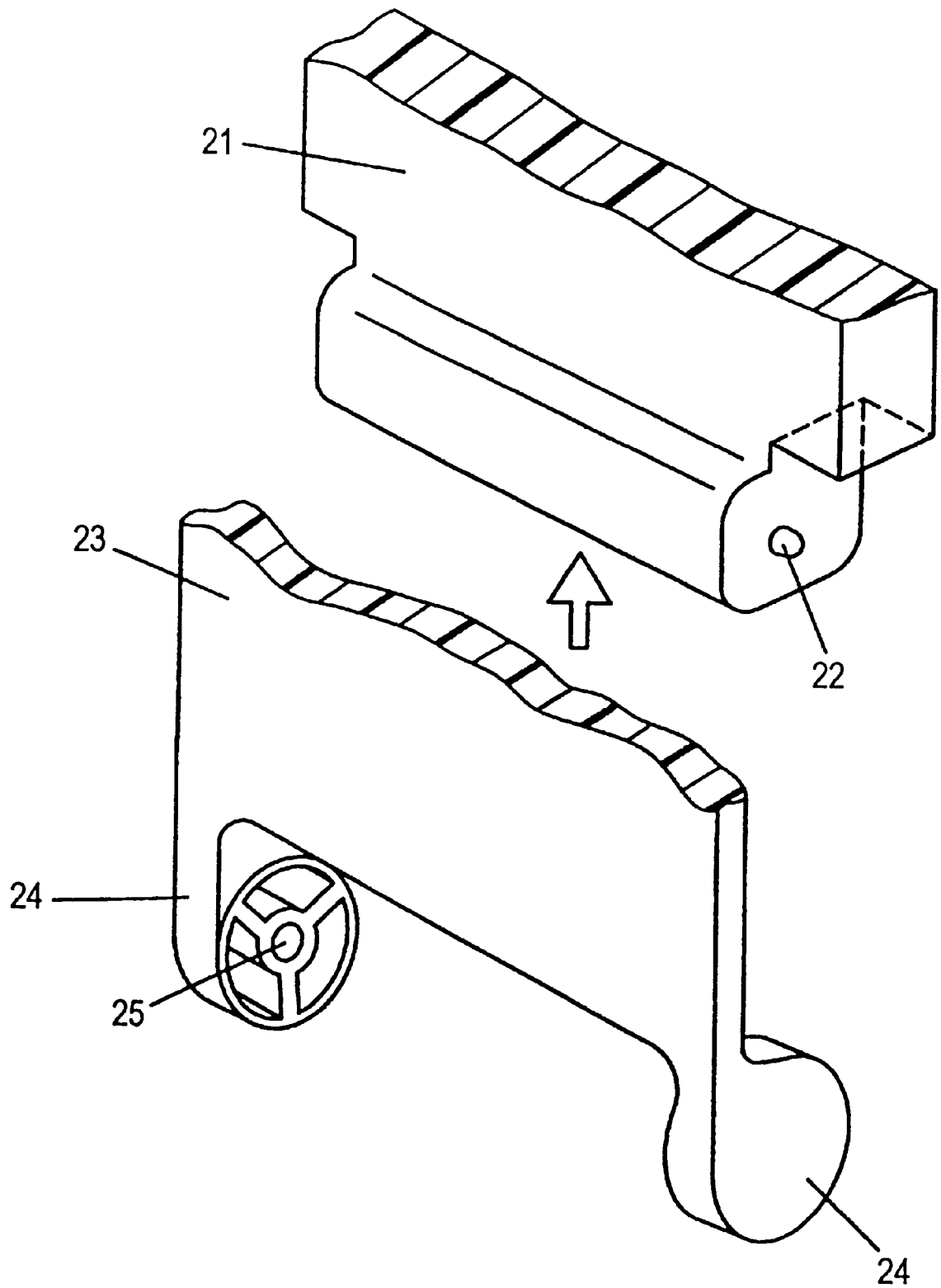
FIG. 6 is a perspective view of an essential part of the remote control in FIG. 5 before it is assembled.

(4) Press the cover further until it rotates by about 270° in total, then the spindle 2 relatively moves along the detaching guide face 8, and the extended part 5 is further deformed elastically until the terminal of the detaching guide face 8 comes off the spindle 2. Namely, the cover 4 is detached from the spindle 2 completely and separated from the housing body 1. FIG. 4d depicts this status.

As described above, the cover 4 is opened by 180° using the spindle 2 as a fulcrum of a lever, and the cover 4 is further pushed down by its end to be rotated until the cover is detached. It requires only a little press power to detach the cover 4. Further, this structure can regulate the elastic deformation to a minimum quantity to prevent the root of the extended part 5 from being deformed or cracked.

Embodiment 2

A modification of Embodiment 1 is described here as Embodiment 2.

1. When the pair of extended parts 5 are not provided on the cover 4, the pair of holes 6, the pair of slopes 7 and 8, and the pair of ribs 9 are provided on the cover 4.

2. When at least one of a pair of slopes 7 and 8 are provided on the cover 4 anyhow, the pair of extended parts 5, the pair of ribs 9 and remained pair of slopes 7 or 8 can be entirely or partially omitted. Although they are omitted, a housing device having substantially the same functions described in Embodiment 1 can be produced. In this case, the pair of protrusions 3 also can be omitted.

The preferred embodiment and the modification described above are just the exemplary embodiments, thus the scope of the present invention is not limited by those embodiments, but is indicated by the claims described hereunder. Modifications and changes within an equivalent scope to the scope of the claims are covered by the present invention.

INDUSTRIAL APPLICABILITY

According to the present invention, a cover can be mounted/detached to/from a housing body with ease, and an excessive elastic deformation is not applied to a cantilever-shaped extended part provided on the cover, whereby a permanent set and a crack can be prevented. The housing device of the present invention can bear repeated mounting/detaching. Because of easy mounting/detaching, the rate of reuse or recycle of the housing device can be increased, thereby contributing to environmental protection as well as saving resources.

The present invention can be applied to a housing of remote control, a control panel disposed on the front of a television receiver, a box on which a television receiver is placed, etc. The present invention is particularly effective to such electronics apparatus as described above.

What is claimed is:

1. A housing device comprising:
   (a) a housing body having a first spindle on a first side of said housing body and a second spindle on a second side of said housing body, and
   (b) a cover comprising:
      (b-1) a first side having a first hole with which said first spindle engages and a second side having a second hole with which said second spindle engages, and
      (b-2) a first slope guiding said first spindle to said first hole and a second slope guiding said second spindle to said second hole in mounting said cover to said housing body, wherein said cover is configured such that said first and second sides of said cover flex outwardly away from said housing body when mounting said cover to said housing body.

2. The housing device of claim 1, wherein a height of said first and second slopes increase gradually from an edge of said cover to said first and second holes, respectively.

3. A housing device comprising:
   (a) a housing body having a first spindle on a first side of said housing body and a second spindle on a second side of said housing body, and
   (b) a cover comprising first and second cantilever-shaped extended parts provided on an end thereof, wherein said first cantilever-shaped extended part has a first face with a first hole rotatively engaging with said first spindle and said second cantilever-shaped extended part has a second face opposing said first face with a second hole rotatively engaging with said second spindle,
      and a first slope guiding said first spindle to said first hole and a second slope guiding said second spindle to said second hole in mounting said cover to said housing body, wherein said cover is configured such that said first and second cantilever-shaped extended parts flex outwardly away from said housing body when mounting said cover to said housing body.

4. The housing device of claim 3, wherein a height of the first and second slopes gradually increase from an edge of the cover to the first and second holes, respectively.

5. A housing device comprising:
   (a) a housing body having a first spindle on a first side of said housing body and a second spindle on a second side of said housing body, and
   (b) a cover comprising:
      (b-1) a first side having a first hole with which said first spindle engages and a second side having a second hole with which said second spindle engages, and
      (b-2) a first slope guiding said first spindle to come off said first hole and a second slope guiding said second spindle to come off said second hole in detaching said cover from said housing body, wherein said cover is configured such that said first and second sides of said cover flex outwardly away from said housing body when detaching said cover from said housing body.

6. The housing device of claim 5, wherein a height of said first and second slopes increase gradually from the first and second hole, respectively, to an edge of the cover.

7. A housing device comprising;
   (a) a housing body having a first spindle and a first protrusion with a predetermined distance therebetween on a first side of said housing body and a second spindle and a second protrusion with a predetermined distance therebetween on a second side of said housing body, and
   (b) a cover having first and second cantilever-shaped elastic parts extended from an end of said cover, wherein said first cantilever-shaped elastic part has a first face with a first hole rotatively engaging with said first spindle and said second cantilever-shaped elastic part has a second face opposing said first face with a second hole rotatively engaging with said second spindle, said first cantilever-shaped elastic part further comprising a first slope for guiding said first spindle to come off said first hole in detaching the cover from the housing body and said second cantilever-shaped elastic part further comprising a second slope for guiding said second spindle to come off said second hole in detaching the cover from the housing body, wherein said first cantilever-shaped elastic part includes a first bar for stopping rotation of said first cantilever-shaped elastic part by hitting said first protrusion and said second cantilever-shaped elastic part includes a second bar for stopping rotation of said second cantilever-shaped elastic part by hitting said second protrusion.

8. The housing device of claim 7, wherein a height of said first and second slopes increase from said first and second hole, respectively, to an edge of said cover.

9. A housing device comprising:
   (a) a housing body having a first spindle on a first side of said housing body and a second spindle on a second side of said housing body, and
   (b) a cover comprising;
      (b-1) a hole rotatively engaging with one of said first and second spindles,
      (b-2) a first slope independently guiding said one of said first and second spindles to said hole in mounting said cover to said housing body, and
      (b-3) a second slope independently guiding said one of said first and second spindles to come off said hole in detaching said cover from said housing body.

10. The housing device of claim 9, wherein a height of said first slope increases gradually from an edge of said cover to said hole, and a height of said second slope increases gradually from said hole to the edge of said cover.

11. A housing device comprising:
   (a) a housing body having a first spindle and a first protrusion with a predetermined distance therebetween on a first side of said housing body and a second spindle and a second protrusion with a predetermined distance therebetween on a second side of said housing body, and (b) a cover having first and second cantilever-shaped elastic parts extended from an end of said cover, wherein said first cantilever-shaped elastic part has a first face with a first hole rotatively engaging with said first spindle and said second cantilever-shaped elastic part has a second face opposing said first face with a second hole rotatively engaging with said second spindle, said first cantilever-shaped elastic part further comprising a first slope for guiding said first spindle to said first hole in mounting said cover to said housing body and said second cantilever-shaped elastic part further comprising a second slope for guiding said second spindle to said second hole in mounting said cover to said housing body, said first cantilever-shaped elastic part further comprising a third slope for guiding said first spindle to come off said first hole in detaching the cover from the housing body and said second cantilever-shaped elastic part further comprising a fourth slope for guiding said second spindle to come off said second hole in detaching the cover from the housing body, wherein said first cantilever-shaped elastic part includes a first bar for stopping rotation of said first cantilever-shaped elastic part by hitting said first protrusion and said second cantilever-shaped elastic part includes a second bar for stopping rotation of said second cantilever-shaped elastic part by hitting said second protrusion.

12. The housing device of claim 11, wherein a height of said first and second slopes increase gradually from an edge of said cover to said first and second holes respectively, and a height of said third and fourth slopes increase gradually from said first and second holes, respectively, to the edge of said cover.

13. A housing device comprising:
(a) a housing body having a first spindle and a first protrusion on a first side of said housing body and a second spindle and a second protrusion on a second side of said housing body,
(b) a cover engaging with at least one of said first and second spindles for covering said housing body, wherein said cover comes off said spindle via said protrusion by opening said cover from closed status by more than 180°.

* * * * *